(12) United States Patent
Furihata

(10) Patent No.: US 8,520,864 B2
(45) Date of Patent: Aug. 27, 2013

(54) PROJECTOR AND AUDIO OUTPUT METHOD

(75) Inventor: Takeshi Furihata, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 642 days.

(21) Appl. No.: 12/814,672

(22) Filed: Jun. 14, 2010

(65) Prior Publication Data

US 2010/0316234 A1 Dec. 16, 2010

(30) Foreign Application Priority Data

Jun. 16, 2009 (JP) ................................. 2009-142880

(51) Int. Cl.
*H03F 99/00* (2009.01)

(52) U.S. Cl.
USPC ................ 381/120; 345/156; 700/94; 353/15

(58) Field of Classification Search
None
See application file for complete search history.

(56) References Cited

U.S. PATENT DOCUMENTS

| 6,039,626 | A | * | 3/2000 | Gerold et al. | 446/175 |
| 6,127,618 | A | * | 10/2000 | Sugiyama | 84/626 |
| 6,856,046 | B1 | * | 2/2005 | Scarlett et al. | 307/125 |
| 2007/0223732 | A1 | * | 9/2007 | Mao | 381/92 |

FOREIGN PATENT DOCUMENTS

JP 5-064286 A 3/1993

OTHER PUBLICATIONS

Arpit Mehta, Keep Power Consumption in Check with Low-Power Comparators that Autosense Plugged-In Accessories, Application Note 4327, Feb. 27, 2009.

* cited by examiner

*Primary Examiner* — Duc Nguyen
*Assistant Examiner* — Taunya McCarty
(74) *Attorney, Agent, or Firm* — ALG Intellectual Property, LLC

(57) ABSTRACT

A projector includes: a first audio input section adapted to input a first sound signal; a second audio input section adapted to input a second sound signal; a first sound amplifier section adapted to amplify the first sound signal received through the second audio input section to generate a first amplified signal; a second sound amplifier section adapted to amplify the second sound signal received through the second audio input section to generate a second amplified signal; a first audio output section adapted to output a first sound based on the first amplified signal; a second audio output section adapted to output a second sound based on the second amplified signal; and a determination section adapted to determine whether or not the first sound signal is being input.

13 Claims, 5 Drawing Sheets

PROJECTOR AND AUDIO OUTPUT METHOD

CROSS-REFERENCE

The entire disclosure of Japanese Patent Application No. 2009-142880, filed Jun. 16, 2009 is expressly incorporated herein by reference.

BACKGROUND

1. Technical Field

The present invention relates to a projector and an audio output method.

2. Related Art

In the case of a projector incorporating a microphone input terminal, a line input terminal, and a speaker, a sound signal from the microphone input terminal and a sound signal from the line input terminal are mixed, and then output from the speaker.

In, for example, JP-A-5-64286, there is a description that audio output without distortion is performed using a microphone mixer circuit provided with a switch, which is turned ON upon insertion of a microphone plug into a microphone input terminal, and a circuit, which lowers the level of a music signal input to a mixer when the switch is turned ON.

However, in the case in which the control of lowering the audio output level is performed as described in the publication described above, there are some cases in which a sufficient sound volume is not obtained even if the user performs an operation of increasing the volume. Because, in order for mixing a plurality of types of sound signals from a plurality of types of input terminals, it is required for the projector or the like to assign an output allowable range of the speaker or the like to each of the sound signals. For example, if the projector or the like assigns a half of the output allowable range to each of the sound signal from the microphone input terminal and the sound signal from the line input terminal, the sound pressure level corresponding to each of the sound signal is reduced, and even in the case in which the user performs an operation of increasing the volume, it is not achievable to obtain the sufficient sound volume.

SUMMARY

An advantage of some aspects of the invention is to solve the problem described above and to provide a projector and an audio output method capable of more appropriately outputting a sound in the situation in which a plurality of types of sound signals can be input and then output simultaneously.

According to an aspect of the invention, there is provided a projector including a first audio input section adapted to input a first sound signal, a second audio input section adapted to input a second sound signal, a first sound amplifier section adapted to amplify the first sound signal received through the first audio input section to generate a first amplified signal, a second sound amplifier section adapted to amplify the second sound signal received through the first audio input section to generate a second amplified signal, a first audio output section adapted to output a first sound based on the first amplified signal, a second audio output section adapted to output a second sound based on the second amplified signal, and a determination section adapted to determine whether or not the first sound signal is being input.

According to the aspect of the invention, even in the situation in which a plurality of types of sound signals can be input and then output simultaneously, the projector can output the respective sounds from the separate audio output sections.

Further, since the projector is provided with the determination section for determining whether or not the first sound signal is being input, the sound can more appropriately be output. It should be noted that since presence or absence of the input of the first sound signal can be determined based on whether or not one of the first sound signal and the first amplified signal exceeds a threshold level, it is possible to perform the determination more accurately. Since it is also possible to determine whether or not the first sound signal is being input by detecting the contact of the terminal in the first audio input section, the determination can more easily be performed.

Further, by providing a microphone input terminal, to which a microphone sound signal is input as the first sound signal, to the first audio input section, the projector can output the microphone sound more appropriately when inputting the microphone sound signal.

Further, by providing an audio input terminal, to which a sound signal from an audio output device is input as the second sound signal, to the second audio input section, the projector can output the sound more appropriately when inputting the sound signal from the audio output device.

Further, by providing a microphone amplifier for amplifying the microphone sound signal from the microphone input terminal, and stopping the power supply to the microphone amplifier when the microphone sound signal is not input, it is possible to provide a projector capable of appropriately controlling the amount of power consumption in accordance with the input condition of the sound signal.

Further, according to another aspect of the invention, there is provided a projector including a first audio input section adapted to input a first sound signal, a second audio input section adapted to input a second sound signal including one of a first channel signal, a second channel signal, and first and second channel signals, a first sound amplifier section adapted to amplify one of the first channel signal of the second sound signal received through the second audio input section and the first sound signal received through the first audio input section to thereby generate a first amplified signal, a second sound amplifier section adapted to amplify the second channel signal of the second sound signal received through the second audio input section to thereby generate a second amplified signal, a first audio output section adapted to output a first sound based on the first amplified signal, and a second audio output section adapted to output a second sound based on the second amplified signal.

Further, according to still another aspect of the invention, there is provided an audio output method including (a) receiving a first sound signal, (b) receiving a second sound signal including one of a first channel signal, a second channel signal, and first and second channel signals, (c) amplifying one of the first channel signal of the second sound signal and the first sound signal to thereby generate a first amplified signal, (d) amplifying the second channel signal of the second sound signal to thereby generate a second amplified signal, (e) making a first audio output section output a first sound based on the first amplified signal, and (f) making a second audio output section output a second sound based on the second amplified signal. It should be noted that in the aspect of the invention, the first channel signal and the second channel signal constituting the second sound signal correspond respectively to an L sound signal and an R sound signal described later.

According to the aspects of the invention, even in the situation in which a plurality of types of sound signals can be input and then output simultaneously, the projector can output the respective sounds from the separate audio output sections, and therefore, the sound can more appropriately be output.

Further, the projector described above can further include the determination section adapted to determine whether or not the first sound signal is being input, and a selection section adapted to input the first channel signal of the second sound signal to the first sound amplifier section if input of the first sound signal is stopped, and input the first sound signal to the first sound amplifier section if the first sound signal is being input.

According to this configuration, the projector can select the sound signal to be used in accordance with presence or absence of the input of the first sound signal. Since presence or absence of the input of the first sound signal can be determined based on whether or not one of the first sound signal and the first amplified signal exceeds a threshold level, it is possible to perform the determination more accurately. Since it is also possible to determine whether or not the first sound signal is being input by detecting the contact of the terminal in the first audio input section, the determination can more easily be performed.

Further, by providing a microphone input terminal, to which a microphone sound signal is input as the first sound signal, to the first audio input section, the projector can output the microphone sound more appropriately when inputting the microphone sound signal.

Further, by providing an audio input terminal, to which a sound signal from an audio output device is input as the second sound signal, to the second audio input section, the projector can output the sound more appropriately when inputting the sound signal from the audio output device.

Further, by providing a microphone amplifier for amplifying the microphone sound signal from the microphone input terminal, and stopping the power supply to the microphone amplifier when the microphone sound signal is not input, it is possible to provide a projector capable of appropriately controlling the amount of power consumption in accordance with the input condition of the sound signal.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some embodiments of the invention applied to a projector will be described with reference to the accompanying drawings. It should be noted that the embodiments described below do not at all limit contents of the invention as set forth in the appended claims. Further, not necessarily all of the constituents shown in the embodiments below are indispensable as the means for solving the problem in the invention set forth in the appended claims.

First Embodiment

Figure 1:
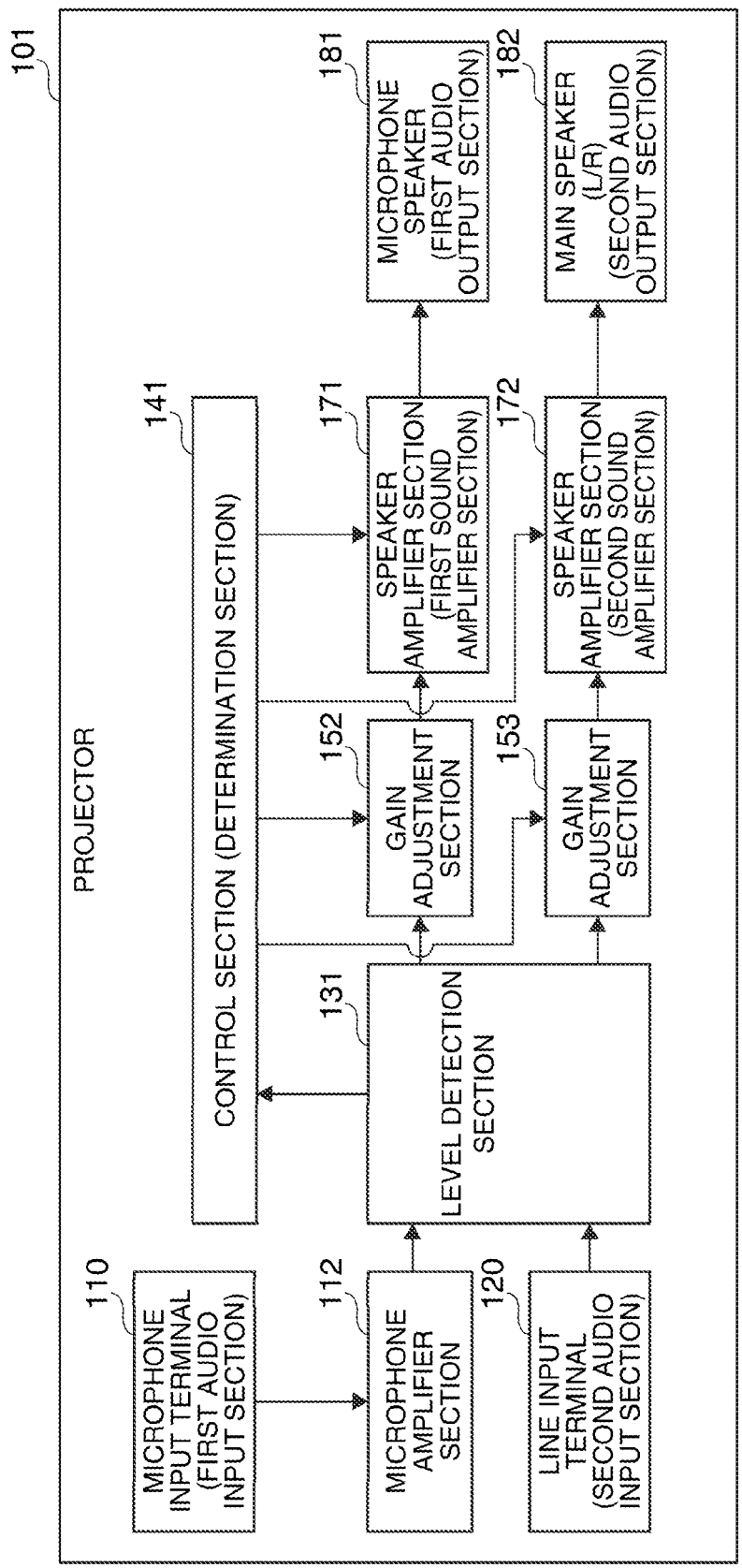
FIG. 1 is a functional block diagram of a projector according to a first embodiment of the invention.

FIG. 1 is a functional block diagram of a projector 101 according to the first embodiment. The projector 101 is configured including a microphone input terminal 110 as a first audio input section, a microphone amplifier section 112, a line input terminal 120 as a second audio input section, and a level detection section 131.

Further, the projector 101 is configured including a gain adjustment section 152 for adjusting a sound volume of a microphone sound, again adjustment section 153 for adjusting a sound volume of a line sound, a control section 141 for controlling the gain adjustment section 152 and so on in accordance with the level detected by the level detection section 131 and so on, a speaker amplifier section 171 as a first sound amplifier section, a speaker amplifier section 172 as a second sound amplifier section, a microphone speaker 181 as a first audio output section, and a main speaker 182 as a second audio output section.

It should be noted that the control section 141 also functions as a determination section for determining whether or not the level of the microphone sound as the first sound signal the level detection section 131 has detected exceeds a predetermined threshold value, thereby determining whether or not the first sound signal is being input.

Further, for example, the level detection section 131 and the gain adjustment sections 152, 153 can be a digital signal processor (DSP) or the like functioning as an audio controller, and the control section 141 can be a CPU or the like. Other sections are typical terminals, amplifiers, speakers, and so on.

Figure 2:
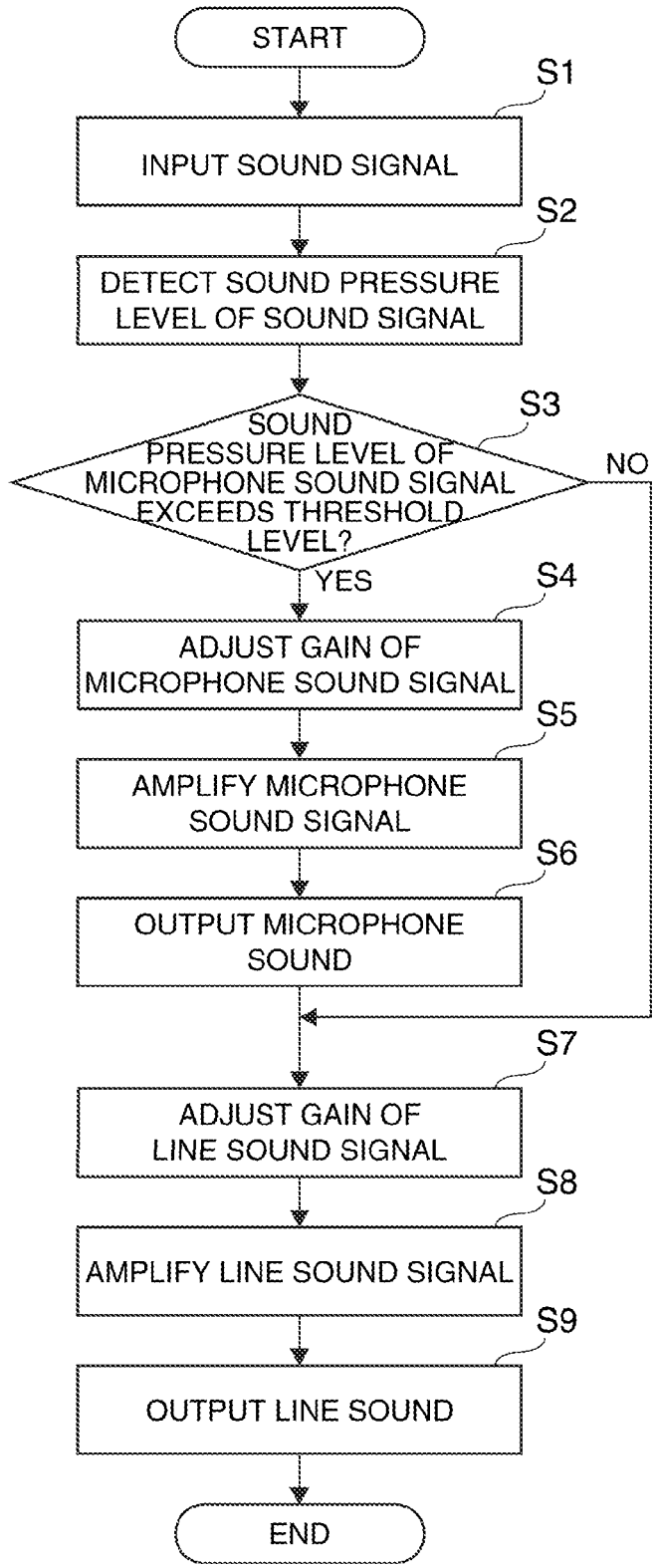
FIG. 2 is a flowchart showing an audio output procedure in the first embodiment.

Then, an audio output procedure in the projector 101 using these sections will be explained. FIG. 2 is a flowchart showing the audio output procedure in the first embodiment.

The microphone input terminal 110 receives a microphone sound signal from the microphone, and the line input terminal 120 as a kind of audio input terminal for inputting a sound signal from an external audio output device (e.g., a CD player, and an amplifier) receives a line sound signal from the audio output device (step S1). The microphone amplifier section 112 amplifies the microphone sound signal from the microphone input terminal 110.

The level detection section 131 detects a voltage level of the microphone sound signal from the microphone amplifier section 112, and further, detects the voltage level of the line sound signal from the line input terminal 120 (step S2).

The control section 141 determines (step S3) whether or not the voltage level of the microphone sound signal exceeds a predetermined threshold level. It should be noted that it has long been known that when plotting the sound pressure, which can be sensed by human, on a graph having a vertical axis representing sound pressure and a horizontal axis representing frequency with respect to each frequency, a so-called bathtub curve is drawn. This shows a human aural characteristic that the audible sound pressure level in low-frequency range and high-frequency range is higher than the audible sound pressure level in the midrange. Therefore, it is possible to adopt a value corresponding to a sound pressure level in the midrange, which can be heard by human with normal sense of hearing, as the predetermined threshold level. Here, the midrange denotes a range no lower than 100 Hz and no higher than 10 kHz. It should be noted that the threshold level described above is preferably set so as to correspond to the audible sound pressure level in a range from 300 Hz to 1 kHz, which is a frequency range often used by human for conversations in particular in the midrange.

If the sound pressure level of the microphone sound signal exceeds the threshold level, the control section 141 controls the gain adjustment section 152 to adjust (step S4) the gain of the microphone sound signal, and controls the speaker amplifier section 171 to amplify (step S5) the microphone sound signal, and then the microphone speaker 181 outputs (step S6) the microphone sound based on the microphone sound signal thus amplified.

Further, the control section 141 controls the gain adjustment section 153 to adjust (step S7) the gain of the line sound signal irrespective of the voltage level of the microphone sound signal, controls the speaker amplifier section 172 to amplify (step S8) the line sound signal, and then the main speaker 182 outputs (step S9) the line sound based on the line sound signal thus amplified.

As described above, according to the present embodiment, even in the situation in which a plurality of types of sound signals can be input and then output simultaneously, the projector 101 is capable of outputting each of the sounds from separate audio output sections, and therefore, it is not required to mix the sounds internally. Thus, the projector 101 can assure a sufficient sound volume, and further prevent the noise sound due to the sound switching and so on from occurring, and therefore, can output the sounds more appropriately.

Further, according to the present embodiment, the projector 101 can determine whether or not the microphone sound signal is actually input by determining whether or not the sound pressure voltage level of the microphone sound signal exceeds the threshold level, and therefore, can more accurately perform the determination. Further, according to the present embodiment, the user can switch between the simultaneous output of the microphone sound and the line sound and the output of the line sound alone by taking out and putting in the microphone plug without performing particular setting.

Second Embodiment

As the first embodiment, the projector 101 having a plurality of speakers is hereinabove explained. Then, a projector having a single speaker set will be explained.

Figure 3:
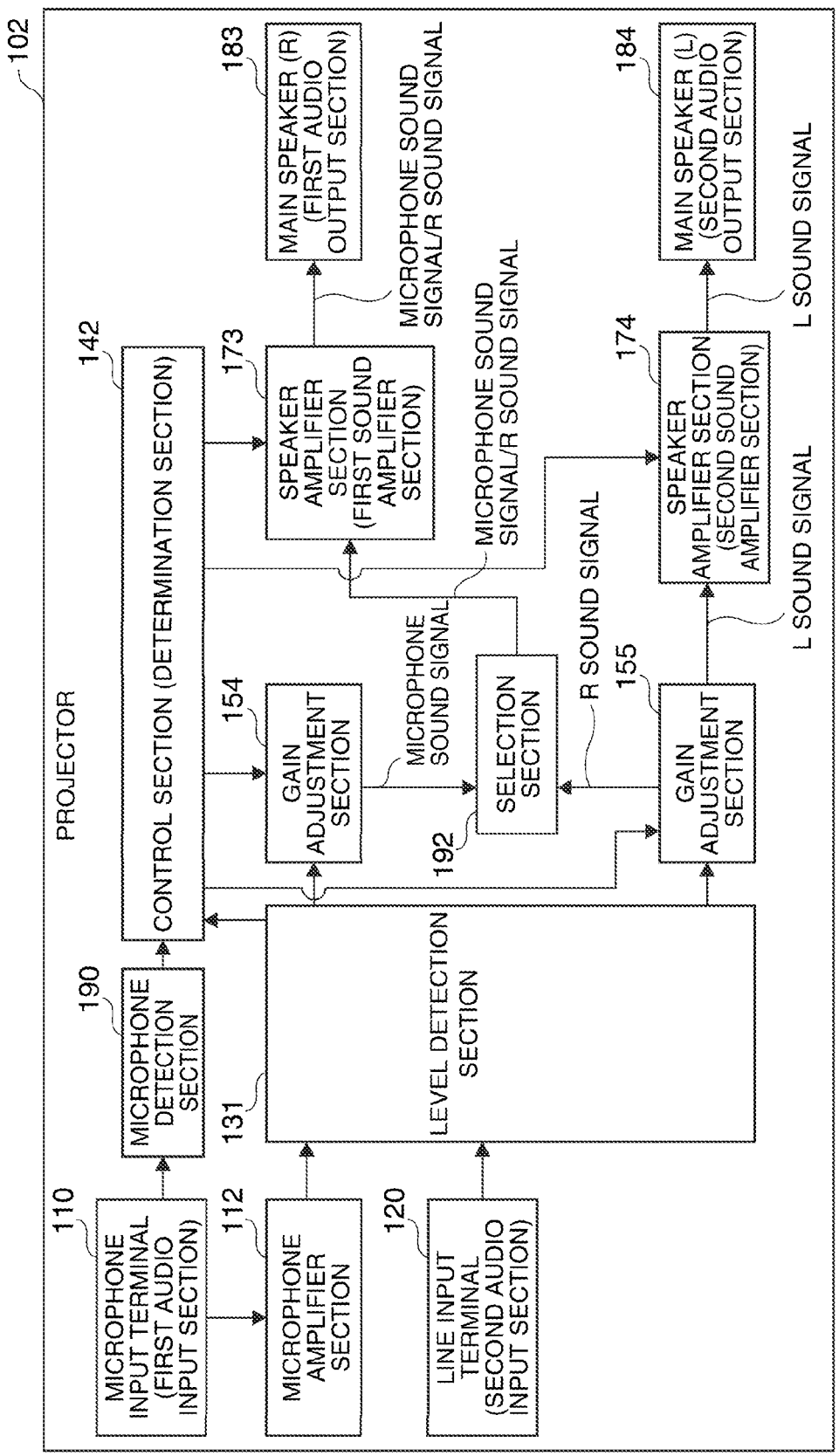
FIG. 3 is a functional block diagram of a projector according to a second embodiment.

FIG. 3 is a functional block diagram of a projector 102 according to the second embodiment. The projector 102 is configured including a microphone input terminal 110 as a first audio input section, a microphone amplifier section 112, a line input terminal 120 as a second audio input section, and a level detection section 131.

Further, the projector 102 is configured including a gain adjustment section 154 for adjusting a sound volume of a microphone sound, again adjustment section 155 for adjusting a sound volume of a line sound, a control section 142 for controlling the gain adjustment section 154 and so on in accordance with the level and so on detected by the level detection section 131, a speaker amplifier section 173 as a first sound amplifier section, a speaker amplifier section 174 as a second sound amplifier section, a main speaker 183 as a first audio output section, and a main speaker 184 as a second audio output section. It should be noted that the main speaker 183 and the main speaker 184 are formed integrally, and are configured so that in normal operations the main speaker 183 outputs an R sound (a sound of a right channel) based on an R sound signal (a sound signal of the right channel) while the main speaker 184 outputs an L sound (a sound of a left channel) based on an L sound signal (a sound signal of the left channel).

Further, the projector 102 is configured including a microphone detection section 190 for determining whether or not the microphone plug has contact with the microphone input terminal 110 and a selection section 192 for selecting one of the sound signal of the R channel from the gain adjustment section 155 and the microphone sound signal from the gain adjustment section 154 in accordance with the control of the control section 142.

Some microphone jacks procurable in the market are provided with a detection switch for detecting connection to the microphone plug. Such a microphone jack can be adopted as the microphone input terminal 110. The microphone detection section 190 can be configured with the detection switch described above and a comparator combined with each other.

Figure 5:
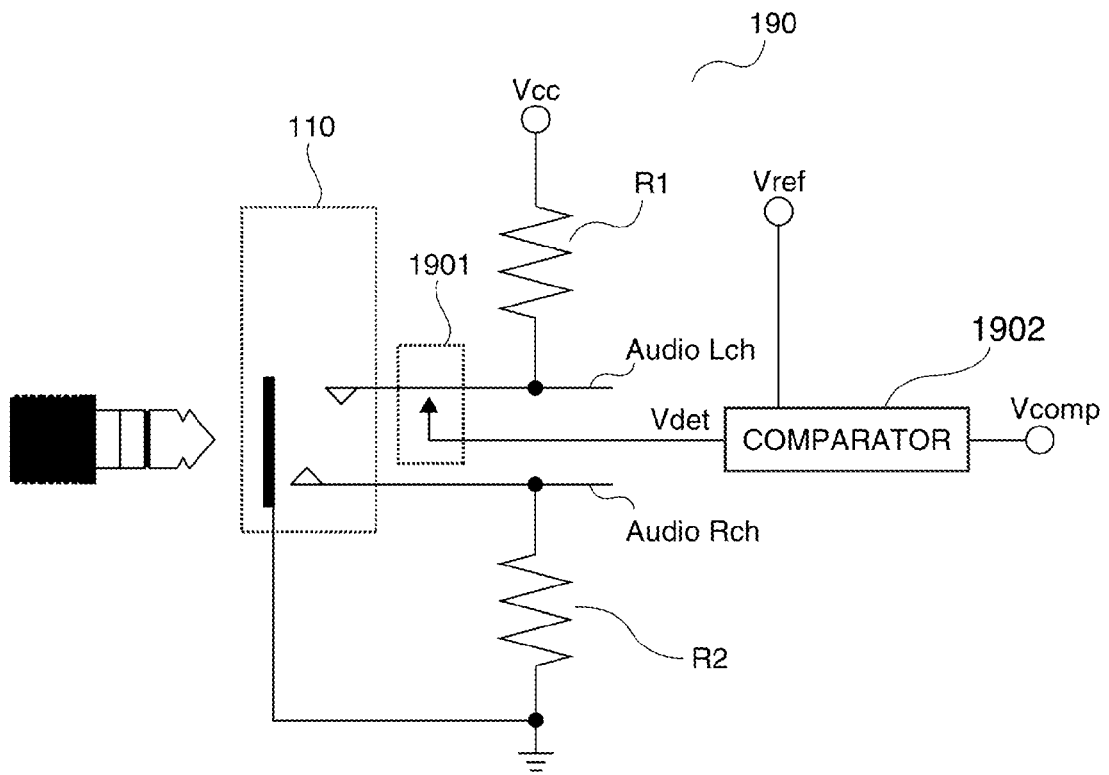
FIG. 5 is a circuit diagram of a microphone detection section in the second embodiment.

FIG. 5 is a diagram showing a circuit configuration of the microphone detection section 190 in the present application example. One end of a detection switch 1901 included in the microphone input terminal 110 is connected to a power supply Vcc via a resistor R1, and the other end of the detection switch 1901 is connected to an input terminal of a comparator 1902. The other end of the detection switch 1901 is grounded via a resistor R2. It is assumed in the present embodiment that the resistance value of the resistor R2 is sufficiently large compared with that of the resistor R1. In other words, since the microphone detection section 190 is configured so as to satisfy R1<<R2, a voltage Vdet applied to the input terminal of the comparator 1902 becomes a high level in the condition in which the microphone plug is not connected to the microphone input terminal 110, and the voltage Vdet applied to the input terminal of the comparator 1902 becomes a low level in the condition in which the microphone plug is connected to the microphone input terminal 110. The comparator 1902 is connected to a reference voltage Vref, and outputs a voltage Vcomp corresponding to the result of comparison between the voltage Vdet and the reference voltage Vref. The microphone detection section 190 outputs the result of detection of the microphone plug as the voltage Vcomp. The control section 142 functioning as the determination section determines whether or not the microphone plug is connected to the microphone input terminal 110 based on the voltage Vdet input from the microphone detection section 190. The selection section 192 can be, for example, a selector. The hardware constituents other than these sections are substantially the same as in the first embodiment, and therefore, the explanations therefor will be omitted.

Figure 4:
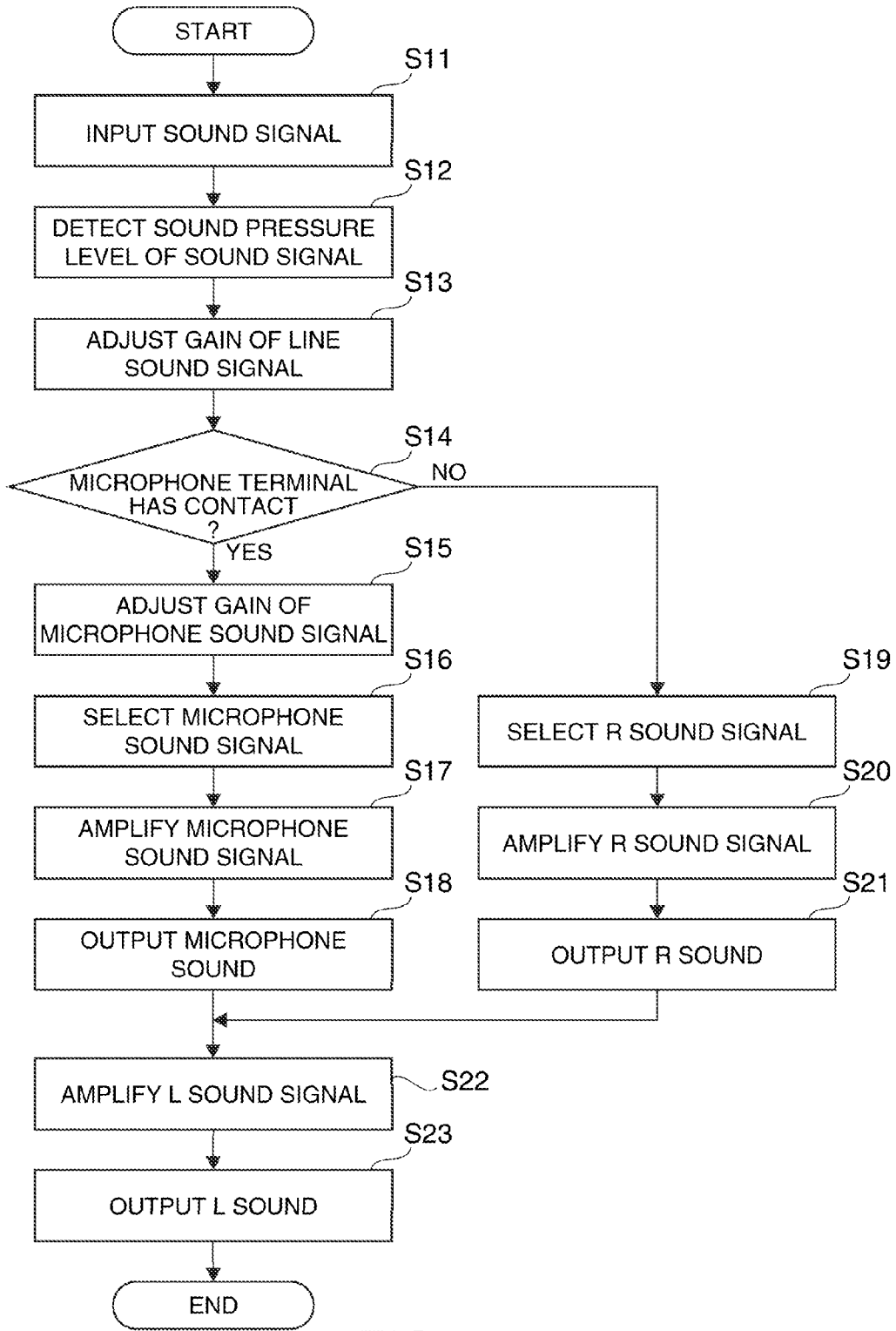
FIG. 4 is a flowchart showing an audio output procedure in the second embodiment.

Then, an audio output procedure in the projector 102 using these sections will be explained. FIG. 4 is a flowchart showing the audio output procedure in the second embodiment.

The microphone sound signal is input to the microphone input terminal 110 from the microphone, and the line sound signal is input to the line input terminal 120 (step S11). The level detection section 131 detects a voltage level of the microphone sound signal from the microphone amplifier section 112, and further, detects the voltage level of the line sound signal from the line input terminal 120 (step S12).

The control section 142 controls the gain adjustment section 155 to adjust (step S13) the gain of the line sound signal.

The control section 142 determines (step S14) whether or not the microphone plug has contact with the microphone input terminal 110 using the voltage Vdet input from the microphone detection section 190.

If the microphone plug has contact therewith, namely the microphone is inserted, the control section 142 controls the gain adjustment section 154 to adjust (step S15) the gain of the microphone sound signal, makes the selection section 192 select (step S16) the microphone sound signal, and controls the speaker amplifier section 173 to amplify (step S17) the microphone sound signal, and the main speaker 183 outputs (step S18) the microphone sound based on the microphone sound signal thus amplified.

On the other hand, if the microphone plug does not have contact therewith, namely the microphone is not inserted, the control section 142 controls the selection section 192 to select (step S19) the R sound signal included in the line sound signal, and controls the speaker amplifier section 173 to amplify (step S20) the R sound signal, and the main speaker 183 outputs (step S21) the R sound based on the R sound signal thus amplified.

Further, the control section 142 controls the speaker amplifier section 174 to amplify (step S22) the L sound signal included in the line sound signal regardless of the contact of the microphone plug, and the main speaker 184 outputs (step S23) the L sound based on the L sound signal thus amplified.

As described above, according also to the present embodiment, the projector 102 has substantially the same functions and advantages as in the first embodiment. For example, in the case in which the line sound signal and the microphone sound signal are input, the projector 102 can simultaneously output the microphone sound and the L sound, and in the case in which the line sound signal is input alone, the projector 102 can output the R sound and the L sound at the same time.

Further, according to the present embodiment, since the speaker dedicated to the microphone is not required, the manufacturers can manufacture the projector 102 with cost lower than in the first embodiment.

Other Embodiments

It should be noted that applications of the invention is not limited to the embodiments described above, but various modifications thereof are possible. For example, it is also possible for the control section 141 to determine whether or not the microphone sound signal is being input from the microphone input terminal 110 based on the level of the sound signal amplified by the speaker amplifier section 171. Further, it is also possible to provide a signal channel for bypassing the microphone amplifier section 112, and determine whether or not the microphone sound signal is being input from the microphone input terminal 110 based on the level of the sound signal not amplified by the microphone amplifier section 112.

Further, the number of microphone input terminals 110 or the number of audio input terminals is not limited to one, but it is also possible to provide a plurality of terminals. Further, the audio input terminal is not limited to the line input terminal 120 as a stereo mini-terminal, but can be, for example, an RCA terminal composed of an R terminal and an L terminal, or an optical digital audio terminal.

Further, it is also possible to provide the microphone detection section 190 of the second embodiment to the projector 101 according to the first embodiment, or to provide the determination section of the first embodiment for determining whether or not the voltage level exceeds the threshold level to the projector 102 according to the second embodiment instead of the microphone detection section 190.

It should be noted that although the configuration of the microphone detection section 190 including the comparator 1902 is described as an example in the explanation of the second embodiment, the invention is not limited thereto. For example, it is possible to adopt a configuration of connecting the other end of the detection switch 1901 to an input port of a CPU or the like incorporating an AD converter. Similarly to the control section 141 described above, it is possible to configure the control section 142 with a CPU or the like, and even with such a configuration, advantages equivalent to those of the aspect of the invention described as the second embodiment can be obtained.

Further, in the case in which the microphone sound signal is not input, it is also possible for the control section 141 to control the power supply section to stop the power supply to the speaker amplifier section 171 and the microphone speaker 181. According to this configuration, the projector 101 can operate with smaller electrical energy.

Further, the first sound signal and the second sound signal are not limited to the microphone sound signal and the line sound signal. For example, the first sound signal can be a sound signal or the like representing the microphone sound converted into sound data.

Further, in the second embodiment, it is also possible that the selection section 192 selects either one of the microphone sound signal and the L sound signal, the main speaker 183 outputs the R sound, and the main speaker 184 outputs either one of the microphone sound and the L sound.

Further, although in the embodiments described above it is assumed that the second sound signal is the sound signal including the L sound signal and the R sound signal, namely a stereo sound signal, the invention is not limited thereto. For example, the second sound signal can be a monaural sound signal. In this case, the first channel signal and the second channel signal according to the aspects of the invention are recognized as terms both denoting the second sound signal.

Further, the projectors 101, 102 are not limited to a liquid crystal projector (a transmissive type, a reflective type such as LCOS), but can be, for example, a projector using a digital micromirror device (DMD). Further, the function of the projectors 101, 102 can be distributed in two or more devices (e.g., a PC and a projector).

What is claimed is:

1. A projector comprising:
   a first audio input section adapted to input a first sound signal;
   a second audio input section adapted to input a second sound signal;
   a first sound amplifier section adapted to amplify the first sound signal received through the first audio input section to generate a first amplified signal;
   a second sound amplifier section adapted to amplify the second sound signal received through the second audio input section to generate a second amplified signal;
   a first audio output section adapted to output a first sound based on the first amplified signal;
   a second audio output section adapted to output a second sound based on the second amplified signal;
   a determination section adapted to determine whether the first sound signal is being input to the first audio input section; and
   a selection section adapted to:
   input one of a right channel signal and a left channel signal of the second sound signal to the first sound amplifier section if input of the first sound signal to the first audio input section is stopped, and
   input the first sound signal, and not input the one of the right channel signal and the left channel signal of the second sound signal, to the first sound amplifier section if the first sound signal is being input to the first audio input section.

2. The projector according to claim 1, wherein
   the determination section determines whether or not one of the first sound signal and the first amplified signal exceeds a threshold level, thereby determining whether the first sound signal is being input to the first audio input section.

3. The projector according to claim 1, wherein
the determination section detects contact of a terminal in the first audio input section, thereby determining whether the first sound signal is being input to the first audio input section.

4. The projector according to claim 1, wherein
the first audio input section includes a microphone input terminal adapted to input a microphone sound signal from a microphone as the first sound signal.

5. The projector according to claim 1, wherein
the second audio input section includes an audio input terminal adapted to input a sound signal from an audio output device as the second sound signal.

6. The projector according to claim 4, further comprising:
a microphone amplifier adapted to amplify the microphone sound signal from the microphone input terminal,
wherein power supply to the microphone amplifier is stopped when input of the microphone sound signal is stopped.

7. A projector comprising:
a first audio input section adapted to input a first sound signal;
a second audio input section adapted to input a second sound signal including one of a first channel signal, a second channel signal, and first and second channel signals;
a first sound amplifier section adapted to amplify one of the first channel signal of the second sound signal received through the second audio input section and the first sound signal received through the first audio input section to thereby generate a first amplified signal;
a second sound amplifier section adapted to amplify the second channel signal of the second sound signal received through the second audio input section to thereby generate a second amplified signal;
a first audio output section adapted to output a first sound based on the first amplified signal;
a second audio output section adapted to output a second sound based on the second amplified signal;
a determination section adapted to determine whether the first sound signal is being input to the first audio input section; and
a selection section adapted to:
input one of a right channel signal and a left channel signal of the second sound signal to the first sound amplifier section if input of the first sound signal to the first audio input section is stopped, and
input the first sound signal, and not input the one of the right channel signal and the left channel signal of the second sound signal, to the first sound amplifier section if the first sound signal is being input to the first audio input section.

8. The projector according to claim 7, wherein
the determination section determines whether or not one of the first sound signal and the first amplified signal exceeds a threshold level, thereby determining whether the first sound signal is being input to the first audio input section.

9. The projector according to claim 7, wherein
the determination section detects contact of a terminal in the first audio input section, thereby determining whether the first sound signal is being input to the first audio input section.

10. The projector according to claim 7, wherein
the first audio input section includes a microphone input terminal adapted to input a microphone sound signal from a microphone as the first sound signal.

11. The projector according to claim 7, wherein
the second audio input section includes an audio input terminal adapted to input a sound signal from an audio output device as the second sound signal.

12. The projector according to claim 10, further comprising:
a microphone amplifier adapted to amplify the microphone sound signal from the microphone input terminal,
wherein power supply to the microphone amplifier is stopped when input of the microphone sound signal is stopped.

13. An audio output method in a projector having a first audio output section and a second audio output section, the method comprising:
(a) receiving a first sound signal;
(b) receiving a second sound signal including one of a first channel signal, a second channel signal, and first and second channel signals;
(c) amplifying one of the first channel signal of the second sound signal and the first sound signal to thereby generate a first amplified signal;
(d) amplifying the second channel signal of the second sound signal to thereby generate a second amplified signal;
(e) making the first audio output section output a first sound based on the first amplified signal;
(f) making the second audio output section output a second sound based on the second amplified signal;
(g) determining whether the first sound signal is being input;
(h) amplifying the first channel signal of the second sound signal to thereby generate the first amplified signal when input of the first sound signal is stopped; and
(i) amplifying the first sound signal, and not amplifying the first channel signal of the second sound signal, to thereby generate the first amplified signal when the first sound signal is being input.

* * * * *